United States Patent
Lee et al.

(10) Patent No.: US 11,791,318 B2
(45) Date of Patent: Oct. 17, 2023

(54) DISPLAY DEVICE

(71) Applicant: Samsung Display Co., LTD., Yongin-si (KR)

(72) Inventors: Seung Min Lee, Yongin-si (KR); Jin Yeong Kim, Yongin-si (KR); Sang Ho Park, Yongin-si (KR); Tae Hoon Yang, Yongin-si (KR); Sung Jin Lee, Yongin-si (KR); Jin Woo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 488 days.

(21) Appl. No.: 16/991,515

(22) Filed: Aug. 12, 2020

(65) Prior Publication Data

US 2021/0151419 A1 May 20, 2021

(30) Foreign Application Priority Data

Nov. 14, 2019 (KR) .......................... 10-2019-0145742

(51) Int. Cl.
*H01L 25/075* (2006.01)
*H01L 27/15* (2006.01)

(52) U.S. Cl.
CPC ........ *H01L 25/0753* (2013.01); *H01L 27/156* (2013.01)

(58) Field of Classification Search
CPC ... H01L 25/0753; H01L 27/156; H01L 33/60; H01L 25/167; H01L 33/382; H01L 33/62
See application file for complete search history.

(56) References Cited

U.S. PATENT DOCUMENTS

| | | |
|---|---|---|
| 8,637,858 B2 | 1/2014 | Huang et al. |
| 8,872,214 B2 | 10/2014 | Negishi et al. |
| 9,112,112 B2 | 8/2015 | Do et al. |
| 9,773,761 B2 | 9/2017 | Do et al. |
| 2011/0089850 A1 | 4/2011 | Shibata et al. |
| 2018/0122836 A1* | 5/2018 | Kang ...................... H01L 33/60 |

(Continued)

FOREIGN PATENT DOCUMENTS

| | | |
|---|---|---|
| KR | 10-1244926 | 3/2013 |
| KR | 10-1490758 | 2/2015 |

(Continued)

*Primary Examiner* — Ratisha Mehta
(74) *Attorney, Agent, or Firm* — KILE PARK REED & HOUTTEMAN PLLC

(57) ABSTRACT

A display device includes a substrate, a display element layer disposed on a first surface of the substrate and including a light emitting element that emits light, and a pixel circuit layer disposed on the display element layer and including a transistor electrically connected to the light emitting element. The display element layer includes a first contact electrode electrically connected to a first end of the light emitting element, and a second contact electrode electrically connected to a second end of the light emitting element. The pixel circuit layer includes a reflective layer disposed on the display element layer and overlapping the light emitting element. One of the first contact electrode and the second contact electrode is electrically connected to the transistor. The reflective layer reflects the light emitted from the light emitting element toward a second surface of the substrate.

11 Claims, 6 Drawing Sheets

(56) References Cited

U.S. PATENT DOCUMENTS

2018/0174519 A1\* 6/2018 Kim .................. H01L 33/06
2018/0188606 A1\* 7/2018 Lee .................. G02F 1/133608
2019/0244567 A1 8/2019 Cho et al.

FOREIGN PATENT DOCUMENTS

KR 10-2919-0006430 1/2019
KR 10-2019-0096475 8/2019

\* cited by examiner

DISPLAY DEVICE

CROSS-REFERENCE TO RELATED APPLICATIONS

This application claims priority to and benefits of Korean patent application No. 10-2019-0145742 under 35 U.S.C. § 119, filed on Nov. 14, 2019 in the Korean Intellectual Property Office, the entire contents of which are incorporated herein by reference.

BACKGROUND

1. Technical Field

Embodiments relate to a display device.

2. Description of the Related Art

A light emitting diode (hereinafter, referred to as an "LED") may have a relatively satisfactory durability even under poor environmental conditions, and may have excellent performance in terms of its lifetime and luminance. Research on the applicability of LEDs to various display devices has become recently appreciably more active.

As a part of such research, technologies of fabricating a rod-type LED having a small size corresponding to a micro-scale or a nano-scale using an inorganic crystalline structure, for example, a structure obtained by growing a nitride-based semiconductor are being developed. For example, rod-type LEDs may be fabricated in a size small enough to form a pixel of a self-emissive display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are directed to a display device having a structure capable of inducing effective light emission and manufacturing process.

An embodiment may provide a display device including a substrate; a display element layer disposed on a first surface of the substrate and including a light emitting element that may emit light; and a pixel circuit layer disposed on the display element layer and including a transistor electrically connected to the light emitting element. The display element layer may include a first contact electrode electrically connected to a first end of the light emitting element; and a second contact electrode electrically connected to a second end of the light emitting element. The pixel circuit layer may include a reflective layer disposed on the display element layer and overlapping the light emitting element. One of the first contact electrode and the second contact electrode may be electrically connected to the transistor. The reflective layer may reflect the light emitted from the light emitting element toward a second surface of the substrate.

In an embodiment, the display element layer may include an insulating layer disposed on the substrate and including an opening through which a portion of one of the first contact electrode and the second contact electrode may be exposed. One of the first contact electrode and the second contact electrode may be electrically connected to the transistor through the opening.

In an embodiment, the display element layer may include a first electrode disposed between the first contact electrode and the substrate and electrically insulated from the first contact electrode; and a second electrode disposes between the second contact electrode and the substrate and electrically insulated from the second contact electrode. The first electrode and the second electrode may be spaced apart from each other with the light emitting element disposed between the first and the second electrode.

In an embodiment, the display element layer may include a first transparent electrode disposed between the first electrode and the substrate, and electrically connected to the first electrode; and a second transparent electrode disposed between the second electrode and the substrate, and electrically connected to the second electrode. The first transparent electrode and the second transparent electrode may be spaced apart from each other with the light emitting element disposed between the first transparent electrode and the second transparent electrode.

In an embodiment, a light transmittance of each of the first transparent electrode and the second transparent electrode may be greater than a light transmittance of each of the first electrode and the second electrode.

In an embodiment, a resistance value of each of the first electrode and the second electrode may be less than a resistance value of each of the first transparent electrode and the second transparent electrode.

In an embodiment, the display element layer may include banks disposed on the substrate and spaced apart from each other with the light emitting element disposed between the banks; and a first electrode and a second electrode disposed on the banks and spaced apart from each other with the light emitting element disposed between the first electrode and the second electrode.

In an embodiment, the first contact electrode may be disposed on the first electrode and electrically connected to the first electrode, and the second contact electrode may be disposed on the second electrode and electrically connected to the second electrode.

In an embodiment, at least one of one end of the first transparent electrode and one end of the second transparent electrode may overlap a portion of the light emitting element.

In an embodiment, a first width of each of the first transparent electrode and the second transparent electrode may be different from a second width of each of the first electrode and the second electrode.

In an embodiment, the second width may be less than the first width.

An embodiment may provide a display device including a substrate; a display element layer disposed on a first surface of the substrate and including a light emitting element that may emit light; and a pixel circuit layer disposed on the display element layer and including a transistor electrically connected to the light emitting element. The display element layer may include a first contact electrode electrically connected to a first end of the light emitting element; a second contact electrode electrically connected to a second end of the light emitting element; a first electrode electrically connected to the first contact electrode; and a second electrode electrically connected to the second contact electrode. One of the first electrode and the second electrode may be electrically connected to the transistor. The light emitted from the light emitting element may be emitted toward a second surface of the substrate.

In an embodiment, the display element layer may include an insulating layer disposed on the substrate and including an opening through which a portion of one of the first electrode and the second electrode may be exposed. One of the first and the second electrodes may be electrically connected to the transistor through the opening.

In an embodiment, the light emitting element may be disposed on the substrate, the first contact electrode may be disposed on the substrate and a first end of the light emitting element, and the second contact electrode may be disposed on the substrate and a second end of the light emitting element.

In an embodiment, the first electrode may be disposed on the substrate and the first contact electrode, and the second electrode may be disposes on the substrate and the second contact electrode. The first electrode and the second electrode may be spaced apart from each other with the light emitting element disposed between the first electrode and the second electrode.

In an embodiment, each of the first electrode and the second electrode may be a reflective electrode that may reflect the light emitted from the light emitting element toward the second surface of the substrate.

In an embodiment, the display element layer may include banks disposed on the substrate and spaced apart from each other with the light emitting element disposed between the banks; and the first electrode and the second electrode disposed on the banks and spaced apart from each other with the light emitting element disposed between the first electrode and the second electrode.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure.

In the drawings.

DETAILED DESCRIPTION OF THE EMBODIMENTS

Figure 1A:
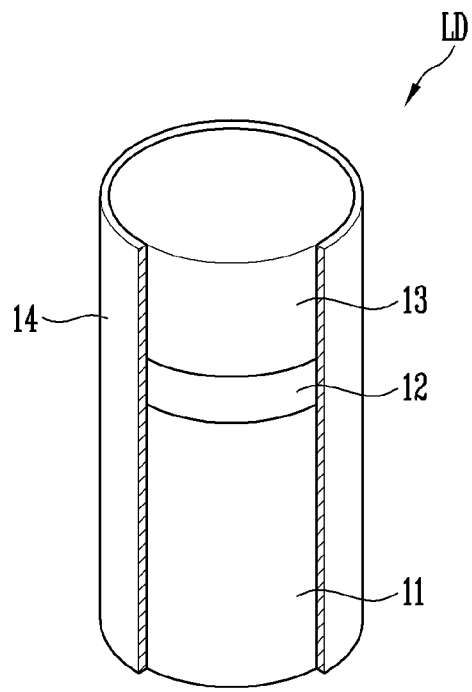
FIGS. 1A and 1B are each a perspective view illustrating a light emitting element in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and technical scope of the disclosure are encompassed herein.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will also be understood that when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under or below a second part, the first part may be not only directly under or below the second part but a third part may intervene between them.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments will hereinafter be described in detail with reference to the accompanying drawings.

Figure 1B:
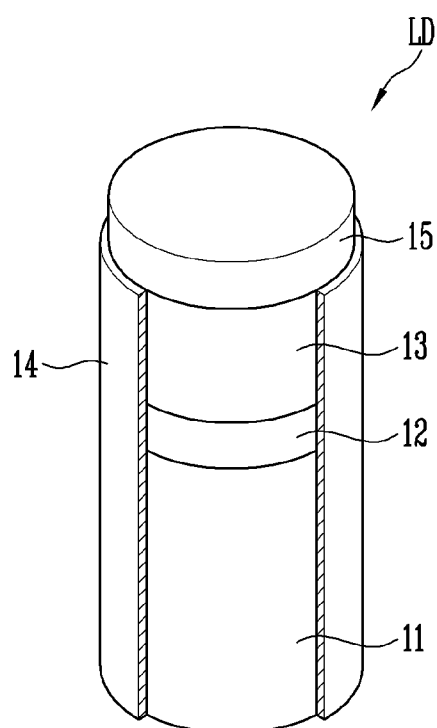

FIGS. 1A and 1B are each a perspective view illustrating a light emitting element LD in accordance with an embodiment. Although FIGS. 1A and 1B illustrate a substantially cylindrical light emitting element LD, the disclosure is not limited thereto. The light emitting element LD may be any of various shapes within the spirit and the scope of the disclosure.

Referring to FIGS. 1A and 1B, the light emitting element LD in accordance with an embodiment may include a first semiconductor layer 11, a second semiconductor layer 13, and an active layer 12 interposed or disposed between the first semiconductor layer 11 and the second semiconductor layer 13.

For example, the light emitting element LD may be a stack formed by successively stacking the first semiconductor layer 11, the active layer 12, and the second semiconductor layer 13.

In an embodiment, the light emitting element LD may be provided or illustrated substantially in the form of a rod extending in a direction. If the direction in which the light emitting element LD extends is defined as a longitudinal direction, the light emitting element LD may have a first end and a second end in the longitudinal direction.

In an embodiment, one of the first semiconductor layer 11 and the second semiconductor layer 13 may be disposed on the or a first end of the light emitting element LD, and the other of the first and the second semiconductor layers 11 and 13 may be disposed on the second end of the light emitting element LD.

In an embodiment, the light emitting element LD may be provided or illustrated substantially in the form of a rod. Here, the term "rod type" may include a rod-like shape and/or a bar-like shape such as a substantially cylindrical shape and/or a substantially prismatic shape extending in the longitudinal direction (for example, to have an aspect ratio greater than 1). For example, the length of the light emitting element LD may be greater than the diameter thereof.

The light emitting element LD may be fabricated in a small size having a diameter and/or length corresponding to, for example, a micro-scale or nano-scale size.

However, the size of the light emitting element LD in accordance with an embodiment is not limited to this, and the size of the light emitting element LD may vary depending on conditions of the display device to which the light emitting element LD may be applied.

The first semiconductor layer 11 may include, for example, at least one n-type semiconductor layer. For instance, the first semiconductor layer 11 may include a semiconductor layer which may include any one semiconductor material of InAlGaN, GaN, AlGaN, InGaN, AlN, and InN, and may be doped with a first conductive dopant such as Si, Ge, or Sn.

The material forming the first semiconductor layer 11 is not limited thereto, and the first semiconductor layer 11 may be formed of various other materials within the spirit and the scope of the disclosure.

The active layer 12 may be formed on the first semiconductor layer 11 and have a single- or multi-quantum well structure. In an embodiment, a cladding layer (not shown) doped with a conductive dopant may be formed or disposed on and/or under or below the active layer 12. For example, the cladding layer may be formed of an ALGaN layer or an InALGaN layer. Material such as AlGaN or AlInGaN may be applied to form the active layer 12.

If an electric field, resulting from a predetermined voltage or more, is applied to the opposite ends of the light emitting element LD, the light emitting element LD may emit light by coupling of electron-hole pairs in the active layer 12.

The second semiconductor layer 13 may be provided or disposed on the active layer 12 and may include a semiconductor layer having a type different from that of the first semiconductor layer 11. For example, the second semiconductor layer 13 may include at least one p-type semiconductor layer. For instance, the second semiconductor layer 13 may include a semiconductor layer which may include any one semiconductor material of InAlGaN, GaN, AlGaN, InGaN, AlN, and InN, and may be doped with a second conductive dopant such as Mg.

The material forming the second semiconductor layer 13 is not limited thereto, and the second semiconductor layer 13 may be formed of various other materials within the spirit and the scope of the disclosure.

In an embodiment, the light emitting element LD may not only include the first semiconductor layer 11, the active layer 12, and the second semiconductor layer 13, but may also include a fluorescent layer, another active layer, another semiconductor layer, and/or an electrode layer provided or disposed on and/or under or below each layer.

In an embodiment, the light emitting element LD may include at least one electrode layer disposed on one side (for example, an upper surface) of the second semiconductor layer 13 or one side (for example, a lower surface) of the first semiconductor layer 11.

For example, as illustrated in FIG. 1B, the light emitting element LD may include an electrode layer 15 disposed on one side of the second semiconductor layer 13. The electrode layer 15 may be an ohmic contact electrode, but it is not limited thereto. As an example, the electrode layer 15 may include metal or a metal oxide. For example, chrome (Cr), titanium (Ti), aluminum (Al), gold (Au), nickel (Ni), indium tin oxide (ITO), and an oxide or alloy thereof may be used alone or in combination with each other. However, the disclosure is not limited thereto. In an embodiment, the electrode layer 15 may be substantially transparent or translucent. Thereby, light generated from the light emitting element LD may be emitted to the outside after passing through the electrode layer 15.

The light emitting element LD may include an insulating film or layer 14. In an embodiment, the insulating film or layer 14 may be omitted, or may be provided or disposed to cover or overlap part of, or only part of the first semiconductor layer 11, the active layer 12, and the second semiconductor layer 13.

For example, the insulating film or layer 14 may be provided or disposed on a portion of the light emitting element LD, other than the opposite ends thereof, so that the opposite ends of the light emitting element LD may be exposed.

For ease of explanation, FIGS. 1A and 1B illustrate the insulating film or layer 14 in which a portion has been removed. The entirety of the side surface of the light emitting element LD may be enclosed by the insulating film or layer 14.

The insulating film or layer 14 may be provided disposed to enclose at least a portion of an outer circumferential surface of the first semiconductor layer 11, the active layer 12, and/or the second semiconductor layer 13. For example, the insulating film or layer 14 may enclose the outer circumferential surface of the active layer 12. In the case where the light emitting element LD includes the electrode layer 15, the insulating film or layer 14 may enclose at least a portion of the outer circumferential surface of the electrode layer 15.

In an embodiment, the insulating film or layer 14 may include a transparent insulating material. For example, the insulating layer 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film or layer 14 is provided or disposed on the light emitting element LD, the active layer 12 may be prevented from short-circuiting with a first and/or second electrode (not illustrated).

As a result of the insulating film or layer 14, an occurrence of a defect on the surface of the light emitting element LD may be minimized, whereby the lifetime and efficiency of the light emitting element LD may be improved. In the case where light emitting elements LD may be disposed in close contact with each other, the insulating film or layer 14 may prevent an undesired short-circuit from occurring between the light emitting elements LD.

The light emitting element LD may be applied as a light source for various display devices. For example, the light emitting element LD may be a light source element for a lighting apparatus or a self-emissive display device.

Figure 2A:
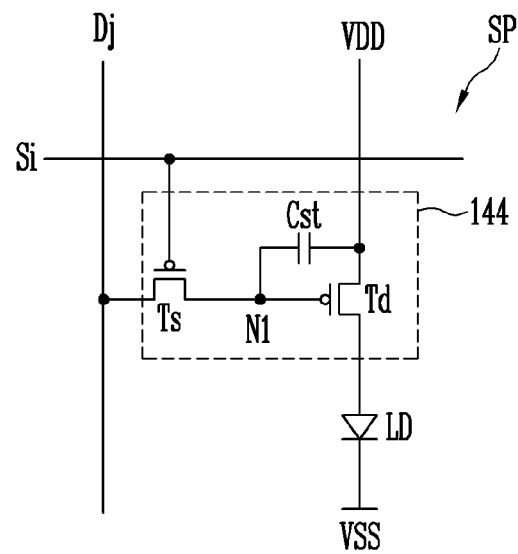
FIGS. 2A and 2B are each equivalent circuit diagrams illustrating sub-pixel that may be applied to a unit emission area of a display device in accordance with an embodiment.
Figure 2B:
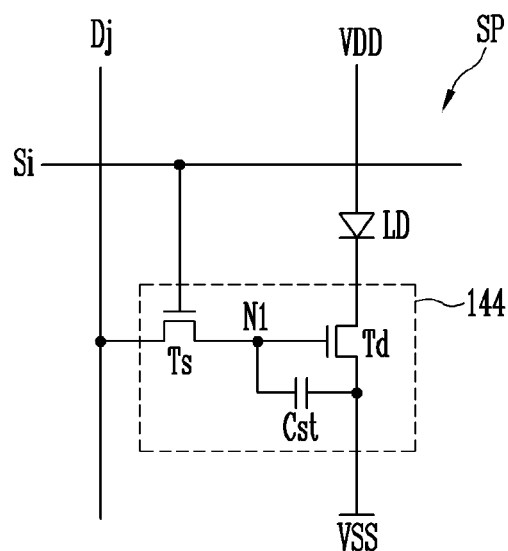

FIGS. 2A and 2B are each equivalent circuit diagrams illustrating sub-pixels that may be applied to a unit emission area of the display device in accordance with an embodiment.

For example, FIGS. 2A and 2B illustrate examples of a sub-pixel that may form an active emission display panel. In an embodiment, the unit emission area may be a pixel area in which a single sub-pixel may be provided or disposed.

Referring to FIG. 2A, a sub-pixel SP may include at least one light emitting element LD, and a pixel driving circuit 144 which may be electrically connected or electrically coupled to the light emitting element LD and drive the light emitting element LD.

The light emitting element LD may include a first electrode (for example, an anode electrode) electrically connected or electrically coupled to a first driving power supply VDD via the pixel driving circuit 144, and a second electrode (for example, a cathode electrode) electrically connected or electrically coupled to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

Each of the light emitting elements LD may emit light at a luminance corresponding to a driving current that may be controlled by the pixel driving circuit 144.

Although FIG. 2A illustrates an embodiment in which each of the sub-pixels SP includes only one light emitting element LD, the disclosure is not limited thereto. For example, the sub-pixel SP may include light emitting elements LD electrically connected or electrically coupled in parallel to each other.

In an embodiment, the pixel driving circuit 144 may include a first transistor Ts, a second transistor Td, and a storage capacitor Cst. However, the structure of the pixel driving circuit 144 is not limited to the embodiment illustrated in FIG. 2A.

The first transistor (Ts; switching transistor) may include a first electrode electrically connected or electrically coupled to a data line Dj, and a second electrode electrically connected or electrically coupled to a first node N1. Here, the first electrode and the second electrode of the first transistor Ts may be different electrodes. For example, if the first electrode is a source electrode, the second electrode is a drain electrode. The first transistor Ts may include a gate electrode electrically connected or electrically coupled to the scan line Si.

When a scan signal having a voltage (for example, a low-level voltage) that may turn on the first transistor Ts is supplied from the scan line Si, the first transistor Ts may be turned on to electrically connect or electrically couple the data line Dj with the first node N1. Here, a data signal of a corresponding frame may be supplied to the data line Dj, whereby the data signal may be transmitted to the first node N1. The data signal transmitted to the first node N1 may be charged to the storage capacitor Cst.

The second transistor (Td; driving transistor) may include a first electrode electrically connected or electrically coupled to the first driving power supply VDD, and a second electrode electrically connected or electrically coupled to the first electrode of each of the light emitting elements LD. The second transistor Td may include a gate electrode electrically connected or electrically coupled to the first node N1. The second transistor Td may control the amount of driving current to be supplied to the light emitting elements LD in response to the voltage of the first node N1.

One electrode of the storage capacitor Cst may be electrically connected or electrically coupled to the first driving power supply VDD, and the other electrode thereof may be electrically connected or electrically coupled to the first node N1. The storage capacitor Cst may charge a voltage corresponding to the data signal supplied to the first node N1, and maintain the charged voltage until a data signal of a subsequent frame may be supplied.

For ease of explanation, FIG. 2A illustrates the driving circuit 144 having a structure including the first transistor Ts that may transmit the data signal to the sub-pixel SP, the storage capacitor Cst that may store the data signal, and the second transistor Td that may supply a driving current corresponding to the data signal to the light emitting element LD.

However, the disclosure is not limited to the foregoing structure, and the structure of the driving circuit 144 may be changed in various ways within the spirit and the scope of the disclosure. For example, the driving circuit 144 may include at least one transistor element such as a transistor element that may compensate for the threshold voltage of the second transistor Td, a transistor element that may initialize the first node N1, and/or a transistor element that may control an emission time of the light emitting element LD, or other circuit elements such as a boosting capacitor for boosting the voltage of the first node N1.

Although in FIG. 2A the transistors, for example, the first and second transistors Ts and Td, included in the driving circuit 144 have been illustrated as being formed of P-type transistors, the disclosure is not limited thereto. In other words, at least one of the first and second transistors Ts and Td included in the driving circuit 144 may be changed to or replaced with an N-type transistor.

Referring to FIG. 2B, in an embodiment, the first and second transistors Ts and Td may be N-type transistors. The configuration and operation of the driving circuit 144 illustrated in FIG. 2B, other than a change in connection positions of some components due to a change in the type of transistor, may be similar to those of the driving circuit 144 of FIG. 2A. Therefore, detailed descriptions will be omitted.

Figure 3:
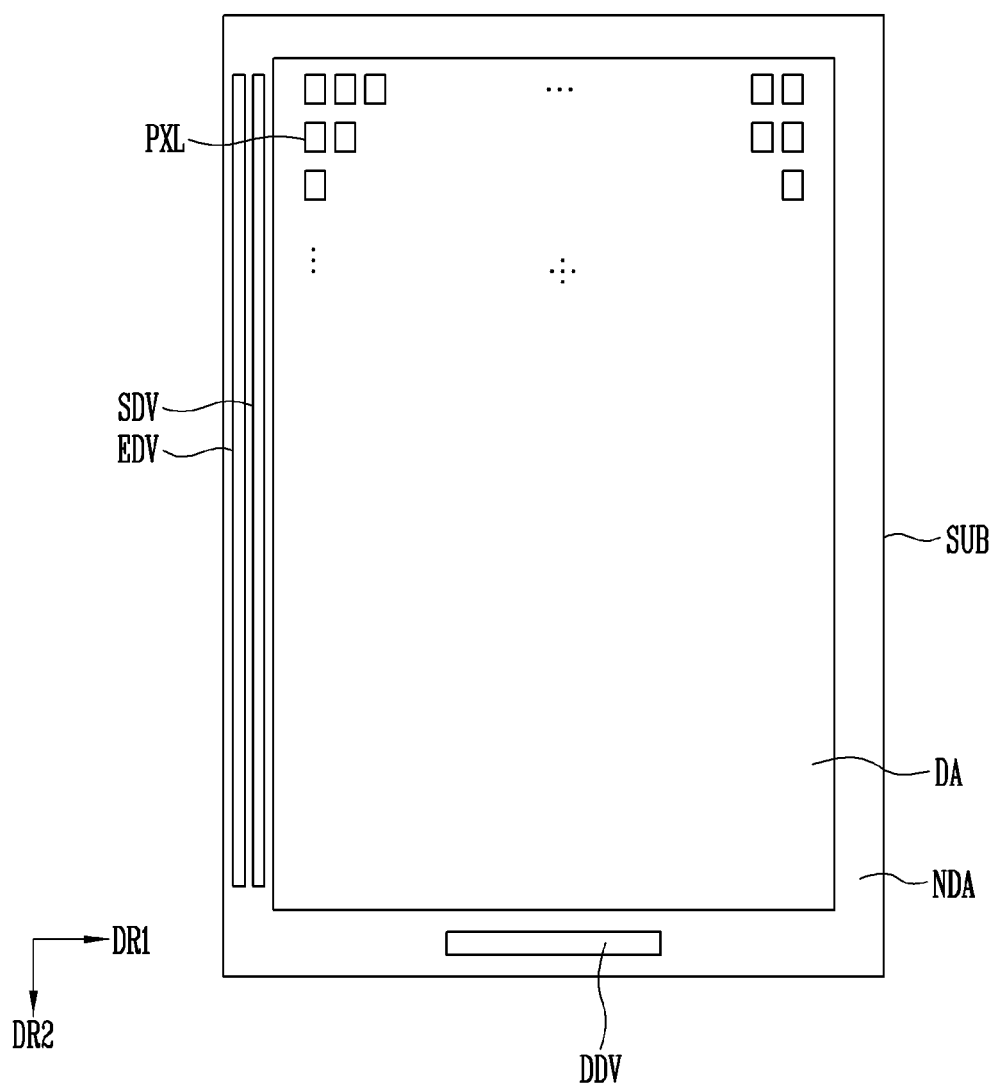
FIG. 3 is a plan view illustrating a display device in accordance with an embodiment.

FIG. 3 is a plan view illustrating a display device in accordance with an embodiment. For example, FIG. 3 is a schematic plan view illustrating the display device that may be applicable to the light emitting element LD illustrated in FIG. 1A or 1B as a light source.

Referring to FIGS. 1A, 1B, and 3, the display device in accordance with an embodiment may include a substrate SUB, pixels PXL which may be provided or disposed on a first surface of the substrate SUB, a driver (not illustrated) which may be provided or disposed on the substrate SUB and that may drive the pixels PXL, and a line component (not illustrated) which may electrically connect or electrically couple the pixels PXL with the driver.

The substrate SUB may include a display area DA and a non-display area NDA. The display area DA may be an area in which the pixels PXL for displaying an image or images may be provided or disposed. The non-display area NDA may be an area in which the driver that may drive the pixels PXL and some of the line component for electrically connecting or coupling the pixels PXL to the driver may be provided or disposed.

The pixels PXL may be provided or disposed in the display area DA on the substrate SUB. Each of the pixels PXL may refer to a smallest unit for displaying an image or images, and pixels may be provided or disposed. Each of the pixels PXL may include a light emitting element LD which may emit white light and/or color light. Each pixel PXL may emit light having any one color among red, green, and blue, but is not limited thereto. For example, each of the pixels PXL may emit light having any one color among cyan, magenta, yellow, and white.

The pixels PXL may be arranged or disposed in a matrix form along rows extending in a first direction DR1 and columns extending in a second direction DR2 intersecting with the first direction DR1. However, the arrangement of the pixels PXL is not limited to a particular arrangement. In other words, the pixels PXL may be arranged or disposed in various forms.

The driver may provide a signal to each pixel PXL through the line component and thus control the operation of the pixel PXL. In FIG. 3, for ease of explanation, the line component may be omitted.

The driver may include a scan driver SDV that may provide a scan signal to the pixels PXL through a scan line, an emission driver EDV that may provide an emission control signal to the pixels PXL through an emission control line, a data driver DDV that may provide a data signal to the pixels PXL through a data line, and a timing controller (not illustrated). The timing controller may control the scan driver SDV, the emission driver EDV, and the data driver DDV.

Figure 4:
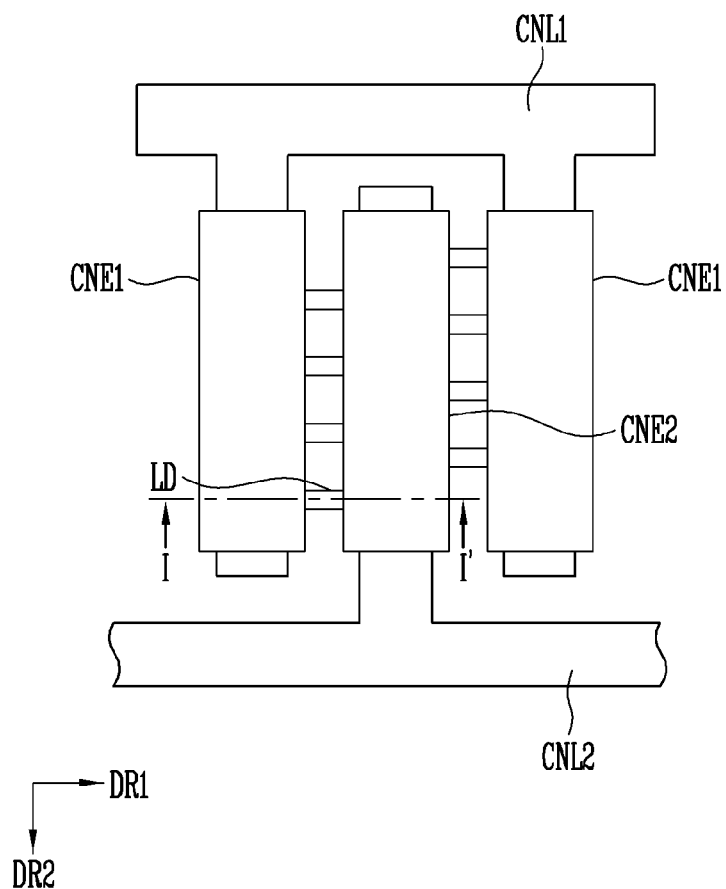
FIG. 4 is a plan view illustrating a unit emission area of a display element layer including a light emitting element of FIG. 1A or 1B in accordance with an embodiment.
Figure 5:
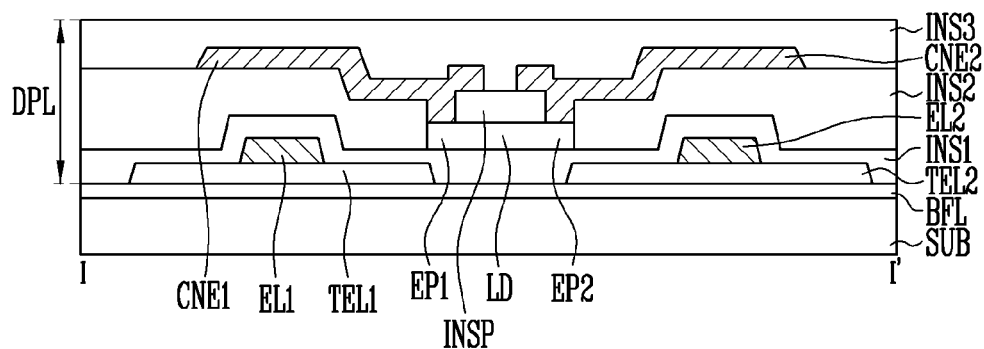
FIG. 5 is a schematic cross-sectional view taken along line I-I' of FIG. 4.
Figure 6:
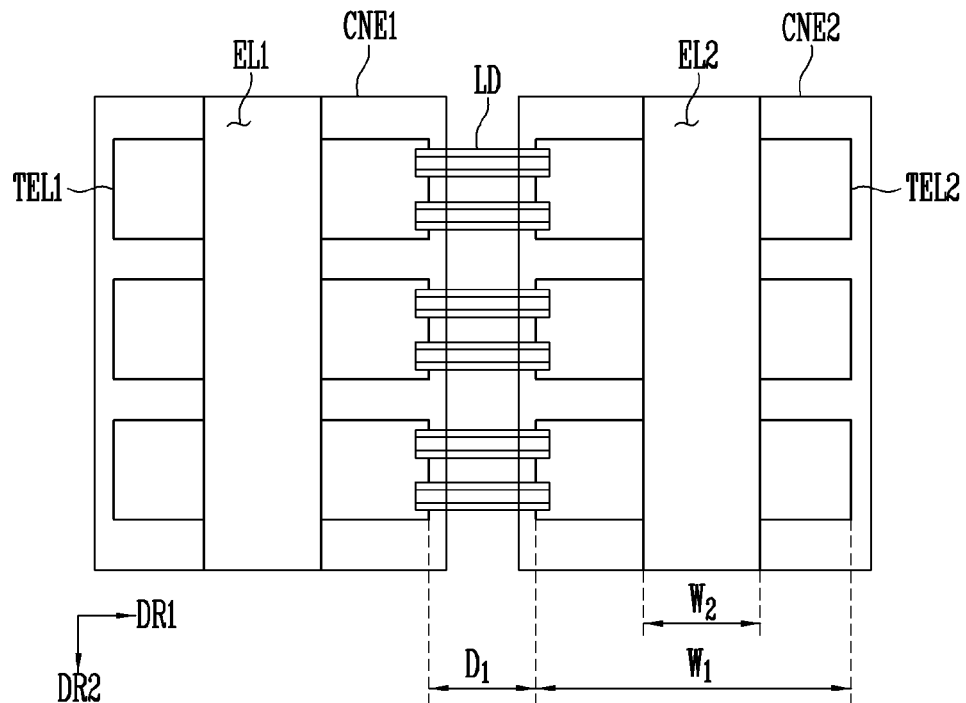
FIG. 6 is a plan view illustrating a display element layer including line I-I' of FIG. 4.

FIG. 4 is a plan view illustrating a unit emission area of a display element layer including the light emitting elements LD of FIG. 1A or 1B, in accordance with an embodiment. FIG. 5 is a schematic cross-sectional view taken along line I-I' of FIG. 4. FIG. 6 is a plan view illustrating a display element layer including line I-I' of FIG. 4.

Although for ease of explanation FIG. 4 illustrates that the light emitting elements LD may be aligned or disposed in the first direction DR1, the arrangement of the light emitting elements LD is not limited thereto. For example, the light emitting elements LD may be aligned or disposed in a direction diagonal to the first direction DR1. In FIG. 4, the unit emission area may be a pixel area including a pixel PXL of an emission display panel.

Referring to FIGS. 1A, 1B, 4, 5, and 6, a display element layer DPL in accordance with an embodiment be provided or disposed on the substrate SUB. In detail, the display element layer DPL may be provided or disposed on a buffer layer BFL that may be provided or disposed on a first surface of the substrate SUB. The display element layer DPL may collectively include light emitting elements LD, a first connection line CNL1, a second connection line CNL2, a first contact electrode CNE1, a second contact electrode CNE2, a first electrode EL1, and a second electrode EL2. The display element layer DPL may include a first transparent electrode TEL1 and a second transparent electrode TEL2.

The substrate SUB may include a transparent insulating material and thus allow light to pass therethrough. Furthermore, the substrate SUB may be formed of a rigid substrate or a flexible substrate. Examples of the rigid substrate may include a glass substrate, a quartz substrate, a glass ceramic substrate, and/or a crystalline glass substrate.

Examples of the flexible substrate may include a film substrate and a plastic substrate, each of which may include a polymer organic material. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). The flexible substrate may include fiber glass reinforced plastic (FRP).

The material that may be applied to the substrate SUB may have a resistance (thermal resistance) to high treatment temperatures during a process of fabricating the display device. In an embodiment, the entirety or at least a portion of the substrate SUB may have flexibility.

The buffer layer BFL may be provided or disposed on a first surface of the substrate SUB. The buffer layer BFL may prevent impurities from diffusing into the light emitting elements LD. The buffer layer BFL may be provided or disposed in a single-layer structure or a multi-layer structure having at least two or more layers. In the case where the buffer layer BFL has a multi-layer structure, the respective layers may be formed of the same or similar material or different materials. The buffer layer BFL may be omitted depending on the material of the substrate SUB or processing conditions.

The first connection line CNL1, the second connection line CNL2, the first electrode EL1, and the second electrode EL2 may be disposed on the buffer layer BFL.

The first connection line CNL1 may extend in the first direction DR1. The second connection line CNL2 may extend in a direction parallel to the extending direction of the first connection line CNL1. For example, the second connection line CNL2 may extend in the first direction DR1.

The first and second connection lines CNL1 and CNL2 may include a conductive material.

The first transparent electrode TEL1 and the second transparent electrode TEL2 may be provided or disposed on the buffer layer BFL. The first transparent electrode TEL1 and the second transparent electrode TEL2 may be formed of a transparent conductive material to allow light emitted from each of the light emitting elements LD to travel toward a second surface of the substrate SUB without loss. For example, the transparent conductive material may include ITO, IZO, ITZO, or other transparent conductive material within the spirit and the scope of the disclosure. As noted, the material of the first transparent electrode TEL1 and the second transparent electrode TEL2 is not limited to the foregoing materials.

In an embodiment, the first transparent electrode TEL1 and the second transparent electrode TEL2 may be omitted depending on the design of the display element layer DPL.

The first electrode EL1 may be provided or disposed on the first transparent electrode TEL1 The second electrode EL2 may be provided or disposed on the second transparent electrode TEL2. In other words, the first transparent electrode TEL1 may be provided or disposed on a surface of the first electrode EL1 that may be oriented toward the substrate SUB. The second transparent electrode TEL2 may be provided or disposed on a surface of the second electrode EL2 that may be oriented toward the substrate SUB. The first electrode EL1 and the first transparent electrode TEL1 may be electrically connected to or electrically coupled to each other. The second electrode EL2 and the second transparent electrode TEL2 may be electrically connected to or electrically coupled to each other.

Each of the first and second electrodes EL1 and EL2 may extend in one direction, for example, the second direction DR2 crossing the first direction DR1. The first electrode EL1 and the second electrode EL2 may be provided on the same surface and may be spaced apart from each other.

The first electrode EL1 may be branched from the first connection line CNL1 in the second direction DR2. The first electrode EL1 and the first connection line CNL1 may be integrally provided to be electrically and/or physically connected to each other. When the first electrode EL1 and the first connection line CNL1 are integrally provided, the first connection line CNL1 may be one region of each of the first electrode EL1, or the first electrode EL1 may be one region of the first connection line CNL1. However, the disclosure is not limited thereto, and according to an embodiment, the first electrode EL1 and the first connection lines CNL1 may be formed separately from each other to be electrically connected to each other through a contact hole and a connection means not shown.

The second electrode EL2 may be branched from the second connection line CNL2 in the second direction DR2. The second electrode EL2 may be provided integrally with the second connection line CNL2, and may be electrically and/or physically connected to each other. When the second electrode EL2 and the second connection line CNL2 are integrally provided, the second connection line CNL2 may be one region of the second electrode EL2, or the second electrode EL2 may be one region of the connection line CNL2. However, the disclosure is not limited thereto, and according to an embodiment, the second electrode EL2 and the second connection line CNL2 may be formed separately from each other, and may be electrically connected to each other through contact holes and connection means not shown.

A first insulating layer INS1 may be provided or disposed on the substrate SUB including the first and second transparent electrodes TEL1 and TEL2 and the first and second electrodes EL1 and EL2. The first insulating layer INS1 may be formed of an inorganic insulating layer including an inorganic material, or an organic insulating layer including an organic material. The first insulating layer INS1 may cover or overlap the first and second transparent electrodes TEL1 and TEL2 and the first and second electrodes EL1 and EL2 and may prevent the first and second transparent electrodes TEL1 and TEL2 and the first and second electrodes EL1 and EL2 from being corroded.

The display element layer DPL may include a bank pattern (not illustrated) provided or disposed on the substrate SUB. Each of the pixels PXL may be divided into an emission area and a bank pattern area in a plan view. The emission area may be an area that may include the light emitting element LD and may emit light generated from the light emitting element LD outward. The bank pattern area may be an area that may enclose the emission area to separate the emission areas of the pixels PXL from each other. The bank pattern area may be an area in which the bank pattern may be disposed. For example, at least one light emitting element LD disposed in the emission area may be enclosed by the bank pattern disposed in the corresponding pixel PXL in a plan view.

The bank pattern may be disposed along the boundary of each pixel PXL, thus preventing light from leaking between adjacent pixels PXL. The bank pattern may be formed simultaneously with the first insulating layer INS1 through an identical process. In other words, the bank pattern may be formed integrally with the first insulating layer INS1. The bank pattern may include the same or similar material as that of the first insulating layer INS1.

The light emitting element LD may be provided or disposed on the first insulating layer INS1. Each of the light emitting elements LD may include a first semiconductor layer 11, a second semiconductor layer 13, and an active layer 12 interposed or disposed between the first semiconductor layer 11 and the second semiconductor layer 13. Each of the light emitting elements LD may include a first end EP1 and a second end EP2 with respect to the first direction DR1. One of the first and second semiconductor layers 11 and 13 may be disposed on the first end EP1, and the other of the first and second semiconductor layers 11 and 13 may be disposed on the second end EP2. In an embodiment, each of the light emitting elements LD may emit any one of red light, green light, blue light, and/or white light.

Referring to FIG. 5, the first transparent electrode TEL1 and the second transparent electrode TEL2 may be provided or disposed on the substrate SUB and spaced apart from each other with the light emitting element LD disposed substantially therebetween. One end of the first transparent electrode TEL1 and one end of the second transparent electrode TEL2 may overlap a portion of the light emitting element LD. The first electrode EL1 and the second electrode EL2 may be provided or disposed on the substrate SUB and spaced apart from each other with the light emitting element LD disposed substantially therebetween.

The first and second transparent electrodes TEL1 and TEL2 and the first and second electrodes EL1 and EL2 may function as alignment electrodes that may align the light emitting elements LD. Referring to FIG. 6, for example, when the light emitting elements LD are aligned, the first electrodes EL1 and the second electrodes EL2 may be successively provided or disposed along the second direction DR2.

The first electrode EL1 and the second electrode EL2 may be electrically connected or electrically coupled to an alignment line (not illustrated) that may supply an alignment voltage to the first electrode EL1 and the second electrode EL2. An alignment voltage applied to a first alignment line (not illustrated) may be transmitted to the first electrode EL1 and the first transparent electrode TEL1 An alignment voltage applied to a second alignment line (not illustrated) may be transmitted to the second electrode EL2 and the second transparent electrode TEL2. Since alignment voltages may be transmitted to the first and second electrodes EL1 and EL2 and the first and second transparent electrodes TEL1 and TEL2, the light emitting elements LD may be provided or disposed on the first insulating layer INS1 between the first transparent electrode TEL1 and the second transparent electrode TEL2 and between the first electrode EL1 and the second electrode EL2.

Resistance values of the first electrode EL1 and the second electrode EL2 may be less than resistance values of the first transparent electrode TEL1 and the second transparent electrode TEL2. In other words, the first electrode EL1 and the second electrode EL2 may each be a low-resistance electrode. The first electrode EL1 and the second electrode EL2 may each have a low resistance value may retain a high alignment voltage applied thereto during an operation of aligning the light emitting elements LD, without a voltage drop until the alignment of the light emitting elements LD may be completed.

If the alignment of the light emitting elements LD is completed, the first electrode EL1 and the second electrode EL2 may be separated from the alignment line.

FIG. 6 is a plan view illustrating the display element layer after the alignment of the light emitting elements has been completed. The first electrodes EL1 may be arranged or disposed to be spaced apart from each other in the second direction DR2 intersecting with the first direction DR1, different from an embodiment illustrated in FIG. 6. The second electrodes EL2 may be arranged or disposed to be spaced apart from each other in the second direction DR2, different from an embodiment illustrated in FIG. 6. The first transparent electrode TEL1 and the second transparent electrode TEL2 may be spaced apart from each other and arranged or disposed in the first direction DR1 of the substrate SUB.

The light emitting elements LD may be provided or disposed between the first transparent electrode TEL1 and the second transparent electrode TEL2 and between the first electrode EL1 and the second electrode EL2. For example, the first transparent electrode TEL1 and the first electrode EL1 may be disposed adjacent to the first end EP1 of the light emitting element LD. The second transparent electrode TEL2 and the second electrode EL2 may be disposed adjacent to the second end EP2 of the light emitting element LD. The first transparent electrode TEL1 and the second transparent electrode TEL2 may be disposed for each of the pixels of the display device.

As an example, the first ends EP1 and the second ends EP2 of the light emitting elements LD may be arranged or disposed in parallel to each other with respect to the second direction DR2, or the first ends EP1 and the second ends EP2 of the light emitting elements LD may not be arranged or disposed in parallel to each other with respect to the second direction DR2. Although FIG. 6 illustrates that the light emitting elements LD may be arranged or disposed in parallel to each other with respect to the first direction DR1, the light emitting elements LD may be arranged or disposed in a diagonal direction with respect to the first direction DR1.

Referring to FIG. 6, although a distance Di between the first transparent electrode TEL1 and the second transparent electrode TEL2 may be about 5 µm or less, the distance between the first transparent electrode TEL1 and the second transparent electrode TEL2 is not limited to the foregoing range. The distance between the first transparent electrode TEL1 and the second transparent electrode TEL2 may be changed to an appropriate value depending on the length of the light emitting element LD.

A first width $W_1$ of each of the first and second transparent electrodes TEL1 and TEL2 may be different from a second width $W_2$ of each of the first and second electrodes EL1 and EL2. In an embodiment, the second width $W_2$ of each of the first and second electrodes EL1 and EL2 may be less than the first width $W_1$ of each of the first and second transparent electrodes TEL1 and TEL2. For example, the first width $W_1$ of each of the first and second transparent electrodes TEL1 and TEL2 may be about 200 μm or less, and the width of each first transparent electrode TEL1 may be substantially identical with or different from the width of each second transparent electrode TEL2. Also, the second width $W_2$ of each of the first and second electrodes EL1 and EL2 may be about 50 μm or less, and the width of the first electrode EL1 may be substantially identical with or different from the width of the second electrode EL2.

However, the width first $W_1$ of each of the first and second transparent electrodes TEL1 and TEL2 and the second width $W_2$ of each of the first and second electrodes EL1 and EL2 are not limited to the foregoing ranges and may be changed to appropriate values depending on the resolution of the display device.

Figure 7:
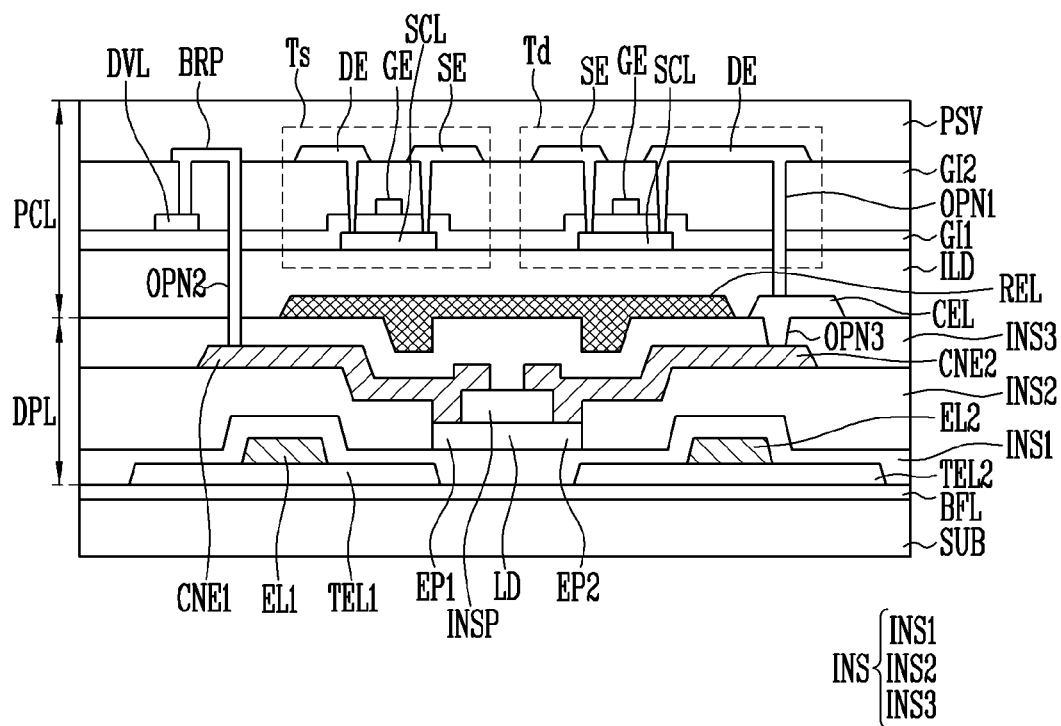
FIG. 7 is a schematic cross-sectional view illustrating a portion of the display device illustrated in FIG. 3 in accordance with an embodiment.

Referring to FIGS. 5 and 7, for example, an insulating pattern INSP may be provided or disposed on the light emitting elements LD aligned or disposed on the substrate SUB. The insulating pattern INSP may be provided and/or formed and/or disposed on each of the light emitting elements LD to cover or overlap a portion of a top surface of the light emitting element LD such that the opposite ends EP1 and EP2 of the light emitting element LD may be exposed to the outside. The insulating pattern INSP may be provided or disposed as an independent insulating pattern in the pixel area, but the disclosure is not limited thereto. After the alignment of the light emitting elements LD in the pixel area have been completed, the insulating pattern INSP may be formed or disposed on each of the light emitting elements LD so that the light emitting element LD may be prevented from being removed from the arranged position.

A second insulating layer INS2 may be provided or disposed on the first insulating layer INS1. The second insulating layer INS2 may be provided or disposed such that the opposite ends EP1 and EP2 of the light emitting element LD may be exposed. For example, the opposite ends EP1 and EP2 of the light emitting element LD may be exposed through space between the insulating pattern INSP and the second insulating layer INS2 that may be spaced apart from each other. The second insulating layer INS2 may include any one insulating material of an inorganic insulating material or an organic insulating material.

The first contact electrode CNE1 and the second contact electrode CNE2 may be respectively provided or disposed on the opposite ends EP1 and EP2 of the light emitting element LD that may be exposed from the insulating pattern INSP and the second insulating layer INS2. For example, the first contact electrode CNE1 may be provided or disposed on the first end EP1 of the light emitting element LD and may come into ohmic contact with the first end EP1 of the light emitting element LD. The second contact electrode CNE1 may be provided or disposed on the first end EP1 of the light emitting element LD and may come into ohmic contact with the first end EP1 of the light emitting element LD.

The first contact electrode CNE1 and the second contact electrode CNE2 may be formed of a transparent conductive material to allow light emitted from each of the light emitting elements LD to pass therethrough without loss. For example, although the transparent conductive material may include ITO, IZO, ITZO, for example, the material of the first contact electrode CNE1 and the second contact electrode CNE2 is not limited to the foregoing materials. The second contact electrode CNE2 may include the same or similar material as that of the first contact electrode CNE1, but is not limited thereto.

In a direction from the substrate SUB toward the pixel circuit layer PCL, the first electrode EL1 may be provided or disposed between the first contact electrode CNE1 and the substrate SUB, and the second electrode EL2 may be provided or disposed between the second contact electrode CNE2 and the substrate SUB. In detail, the first and second contact electrodes CNE1 and CNE2 may be provided or disposed over the first and second electrodes EL1 and EL2 with the first insulating layer INS1 and the second insulating layer INS2 disposed therebetween. In other words, the first contact electrode CNE1 may be electrically insulated from the first electrode EL1. The second contact electrode CNE2 may be electrically insulated from the second electrode EL2.

A third insulating layer INS3 may be provided or disposed on the first contact electrode CNE1, the second contact electrode CNE2, and the second insulating layer INS2. The third insulating layer INS3 may cover or overlap the first and second contact electrodes CNE1 and CNE2 and may prevent the first and second contact electrodes CNE1 and CNE2 from being exposed, thus preventing the first and second contact electrodes CNE1 and CNE2 from being corroded. The third insulating layer INS3 may include any one insulating material of an inorganic insulating material or an organic insulating material.

An overcoat layer (not illustrated) may be provided or disposed over the third insulating layer INS3. The overcoat layer may be an encapsulating layer that may prevent oxygen, water, or the like from penetrating into the light emitting elements LD.

FIG. 7 is a schematic cross-sectional view illustrating a portion of the display device illustrated in FIG. 3 in accordance with an embodiment. Components which are not separately explained in the following description comply with that of the foregoing embodiments. The same reference numeral will be used to designate the same component, and a similar reference numeral will be used to designate a similar component.

Referring to FIG. 7, the display device may include a substrate SUB, a buffer layer BFL, a display element layer DPL, and a pixel circuit layer PCL. The display element layer DPL may include a first transparent electrode TEL1, a second transparent electrode TEL2, a first electrode EL1, a second electrode EL2, a first contact electrode CNE1, a second contact electrode CNE2, a light emitting element LD, and an insulating layer INS.

The first transparent electrode TEL1 and the second transparent electrode TEL2 may be provided or disposed on the buffer layer BFL provided or disposed on a first surface of the substrate SUB. The first and second transparent electrodes TEL1 and TEL2 may be spaced apart from each other with the light emitting element LD disposed therebetween.

The first electrode EL1 may be provided or disposed on the first transparent electrode TEL1 and may be electrically connected to or electrically coupled with the first transparent electrode TEL1. The second electrode EL2 may be provided or disposed on the second transparent electrode TEL2 and be electrically connected to or electrically coupled with the second transparent electrode TEL2. The first and second electrodes EL1 and EL2 may be spaced apart from each other with the light emitting element LD disposed therebetween.

In an embodiment, the insulating layer INS may be a single-layer structure or a multi-layer structure including two or more layers. The insulating layer INS may include an opening through which a portion of one of the first and second contact electrodes CNE1 and CNE2 may be exposed. For example, the insulating layer INS may include an opening OPN2 through which a portion of the first contact electrode CNE1 may be exposed, and openings OPN1 and OPN3 through which portions of the second contact electrode CNE2 may be exposed. One of the first and second contact electrodes CNE1 and CNE2 may be electrically connected to or electrically coupled with a transistor of the pixel circuit layer PCL through the opening provided or disposed in the insulating layer INS.

The first insulating layer INS1 may be provided or disposed on the buffer layer BFL on which the first and second transparent electrodes TEL1 and TEL2 and the first and second electrodes EL1 and EL2 may be provided or disposed. The light emitting element LD may be provided or disposed on the first insulating layer INS1.

An insulating pattern INSP may be provided or disposed on the light emitting element LD. The second insulating layer INS2 may be provided or disposed on the first insulating layer INS1. The first contact electrode CNE1 and the second contact electrode CNE2 may be respectively provided or disposed on the opposite ends EP1 and EP2 of the light emitting element LD that may be exposed from the insulating pattern INSP and the first insulating layer INS1.

The third insulating layer INS3 may be provided or disposed on the first contact electrode CNE1, the second contact electrode CNE2, and the second insulating layer INS2. An overcoat layer (not illustrated) may be provided or disposed over the third insulating layer INS3. The third insulating layer INS3 may be formed as the overcoat layer.

The pixel circuit layer PCL may include a reflective layer REL, a first transistor Ts, a second transistor Td, a driving voltage line DVL, and a bridge pattern BRP.

The reflective layer REL may be provided or disposed on the third insulating layer INS3 of the display element layer DPL. Here, the reflective layer REL may overlap the light emitting element LD. Light emitted from the light emitting element LD may be reflected by the reflective layer REL and emitted toward a second surface (for example, a bottom surface) of the substrate SUB. The reflective layer REL may guide light emitted from the light emitting element LD toward the second surface (for example, the bottom surface) of the substrate SUB. For example, light emitted from the light emitting element LD may be reflected from the reflective layer REL and emitted toward the bottom surface of the substrate SUB.

In an embodiment, light emitted from the light emitting element LD may be effectively guided toward the bottom surface of the substrate SUB by the reflective layer REL. Thereby, the collectivity of light emitted from the light emitting element LD toward the bottom surface of the substrate SUB may be enhanced.

The first electrode EL1 and the second electrode EL2 may include a conductive material.

The light transmittance of the first transparent electrode TEL1 and the second transparent electrode TEL2 may be greater than the light transmittance of the first electrode EL1 and the second electrode EL2. In the case where the light transmittance of the first and second transparent electrodes TEL1 and TEL2 is greater than the light transmittance of the first and second electrodes EL1 and EL2, light that may be emitted from the light emitting element LD and reflected by the reflective layer REL may be emitted toward the bottom surface of the substrate SUB without light loss. Therefore, the display device may display an image or images having excellent quality on the bottom surface of the substrate SUB.

An interlayer insulating layer ILD may be provided or disposed on the third insulating layer INS3 on which the reflective layer REL may be disposed.

The first transistor Ts may be a switching transistor which may be electrically connected or electrically coupled to the second transistor Td to switch the second transistor Td. The second transistor Td may be a driving transistor which may be electrically connected or electrically coupled to the light emitting element LD to drive the light emitting element LD.

Each of the first and second transistors Ts and Td may include a semiconductor layer SCL, a gate electrode GE, a source electrode SE, and a drain electrode DE.

The semiconductor layer SCL may be provided or disposed on the interlayer insulating layer ILD. The semiconductor layer SCL may include a source area and a drain area which may respectively contact the corresponding source electrode SE and the corresponding drain electrode DE. An area between the source area and the drain area may be a channel area. The semiconductor layer SCL may be a semiconductor pattern formed of polysilicon, amorphous silicon, an oxide semiconductor, or other materials within the spirit and the scope of the disclosure. The channel area may be a semiconductor pattern doped with an impurity. The impurity may be an impurity such as an n-type impurity, a p-type impurity or other metals.

The gate electrode GE may be provided or disposed on the corresponding semiconductor layer SCL with a first gate insulating layer GI1 interposed therebetween.

The source electrode SE and the drain electrode DE that may be included in the first transistor Ts may be respectively electrically connected to or electrically coupled to the source area and the drain area of the corresponding semiconductor layer SCL through contact holes passing through the second gate insulating layer GI2 and the first gate insulating layer GI1.

The source electrode SE of the second transistor Td may be electrically connected to or electrically coupled to the source area of the corresponding semiconductor layer SCL through a contact hole passing through the second gate insulating layer GI2 and the first gate insulating layer GI1.

In an embodiment, the drain electrode DE of the second transistor Td may be electrically connected to or electrically coupled to the drain area of the corresponding semiconductor layer SCL through a contact hole passing through the second gate insulating layer GI2 and the first gate insulating layer GI1. Furthermore, the drain electrode DE of the second transistor Td may be electrically connected to or electrically coupled to a connection electrode CEL provided or disposed on the third insulating layer INS3, through a first opening OPN1 that may sequentially pass through the second gate insulating layer GI2, the first gate insulating layer GI1, and the interlayer insulating layer ILD.

The connection electrode CEL may be electrically connected to or electrically coupled to the second contact electrode CNE2 provided or disposed on the second insulating layer INS2, through a third opening OPN3 that may pass through the third insulating layer INS3. In other words, the drain electrode DE of the second transistor Td may be electrically connected to or coupled to the second contact electrode CNE2 via the connection electrode CEL.

Different from the embodiment illustrated in FIG. 7, the connection electrode CEL may be omitted, and the drain electrode DE of the second transistor Td may be electrically connected to or electrically coupled to the second contact electrode CNE2 through the first opening OPN1 that may pass through the second gate insulating layer GI2, the first gate insulating layer GI1, the interlayer insulating layer ILD, and the third insulating layer INS3.

Although the driving voltage line DVL may be provided or disposed on the first gate insulating layer GI1, the position of the driving voltage line DVL is not limited thereto. A signal corresponding to a driving voltage may be supplied from a driver (not illustrated) to the driving voltage line DVL.

The bridge pattern BRP may be provided or disposed on the driving voltage line DVL with the second gate insulating layer GI2 interposed or disposed therebetween.

The bridge pattern BRP may be electrically connected to or electrically coupled to the driving voltage line DVL through a contact hole that may pass through the second gate insulating layer GI2. As an example, the bridge pattern BRP may be electrically connected to or electrically coupled to the first contact electrode CNE1 through a second opening OPN2 that may sequentially pass through the second gate insulating layer GI2, the first gate insulating layer GI1, the interlayer insulating layer ILD, and the third insulating layer INS3.

The pixel circuit layer PCL may include a passivation layer PSV that may cover or overlap the first transistor Ts and the second transistor Td. The passivation layer PSV may include at least one of an inorganic insulating layer formed of an inorganic material, and an organic insulating layer formed of an organic material. For example, the passivation layer PSV may include the inorganic insulating layer, and the organic insulating layer provided or disposed on the inorganic insulating layer.

A driving pad (not illustrated) electrically connected to or electrically coupled to the driver that may drive the pixels PXL may be provided or disposed on the passivation layer PSV. The driving pad may be electrically connected to or electrically coupled to the drain electrode DE of the second transistor Td through a contact hole passing through the passivation layer PSV. An encapsulation layer (not illustrated) may be provided or disposed on the passivation layer PSV on which the driving pad may be provided or disposed, thus protecting the driving pad.

As described above, the drain electrode DE of the second transistor Td may be electrically connected to or electrically coupled to the second contact electrode CNE2 that may be disposed under or below the second transistor Td. Therefore, the second contact electrode CNE2 may receive a signal from the second transistor Td.

The bridge pattern BRP that may be electrically connected to or electrically coupled to the driving voltage line DVL may be electrically connected to or electrically coupled to the first contact electrode CNE1. Therefore, the first contact electrode CNE1 may receive a signal from the driving voltage line DVL.

The first end EP1 of the light emitting element LD may contact the first contact electrode CNE1. The second end EP2 of the light emitting element LD may contact the second contact electrode CNE2. Hence, the light emitting element LD may receive a predetermined voltage through the first contact electrode CNE1 and the second contact electrode CNE2. If an electric field resulting from a predetermined voltage or more is applied to the opposite ends EP1 and EP2 of the light emitting element LD, the light emitting element LD may emit light by coupling of electron-hole pairs in the active layer 12 of the light emitting element LD. Thereafter, as described above, light emitted from the light emitting element LD may be emitted toward the bottom surface of the substrate SUB.

The display device may include a polarizing film (not illustrated). The polarizing film may prevent external light from being reflected by the display device. The polarizing film may include a line polarizer, and a phase difference layer disposed on the line polarizer. The polarizing film may be disposed on the second surface (for example, the bottom surface) of the substrate SUB, for example, on a surface on which the display element layer DPL may not be provided or disposed.

A display device may include a structure in which a substrate, a pixel circuit layer provided or disposed on a surface of the substrate, and a display element layer provided or disposed on the pixel circuit layer may be successively stacked. During a process of manufacturing the display device having the above-noted structure, a relatively large number of masks may be needed to form the pixel circuit layer and the display element layer on the substrate. Hence, there may be a problem affecting the efficiency and productivity of the display device.

On the other hand, the display device in accordance with an embodiment may include a structure in which a substrate SUB, a display element layer DPL provided or disposed on a surface of the substrate SUB, and a pixel circuit layer PCL provided or disposed on the display element layer DPL may be successively stacked. In other words, after the display element layer DPL has been formed or disposed on the substrate SUB, the pixel circuit layer PCL may be formed or disposed on the display element layer DPL. Therefore, the number of masks required during a process of manufacturing the display device may be reduced. For example, compared to the process of manufacturing the above-mentioned display device having the prior structure (a pixel circuit layer provided or disposed on a surface of the substrate and a display element layer provided or disposed on the pixel circuit layer) a process of forming a bank BNK, a process of forming a connection electrode CEL and a reflective layer REL on separate layers, and so forth may be omitted. Due to a bottom emission structure, the number of insulating layers included in the display element may be reduced, so that the number of masks required during a process of manufacturing the display device may be effectively reduced.

The display element layer DPL may be formed or disposed on the substrate SUB, and the pixel circuit layer PCL may be formed or disposed after a test for the display element layer DPL has been performed. Therefore, a product loss rate during the manufacturing process may be reduced.

Figure 8:
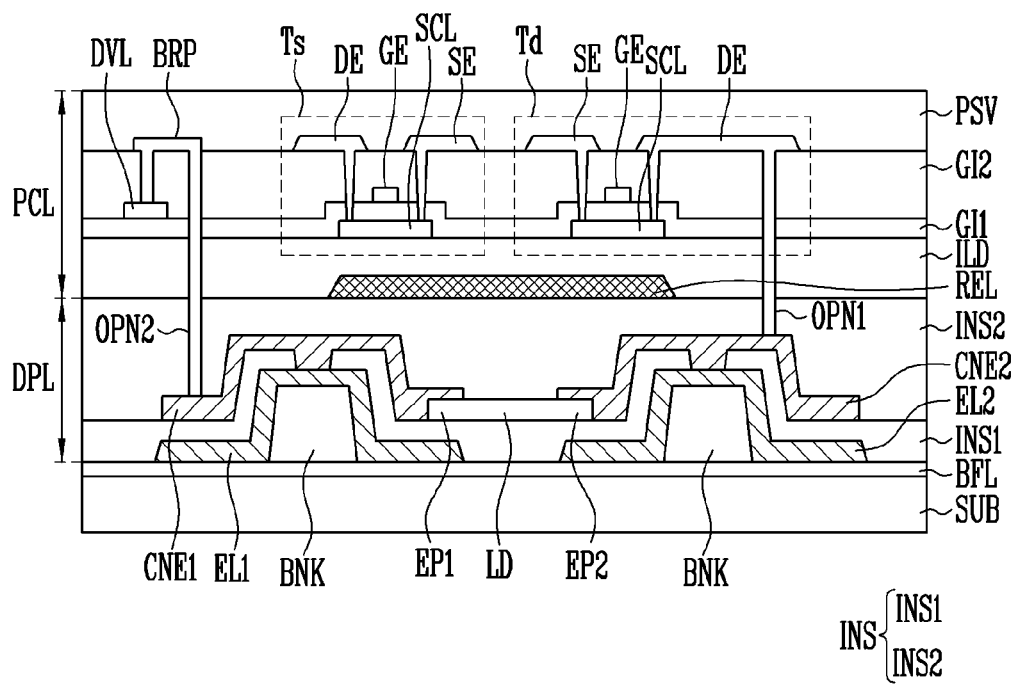
FIG. 8 is a schematic cross-sectional view illustrating a display device in accordance with an embodiment.

FIG. 8 is a schematic cross-sectional view illustrating a display device in accordance with an embodiment. In an embodiment, the following description will be mainly focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

The display device may include a substrate SUB, a display element layer DPL, and a pixel circuit layer PCL. The display element layer DPL may include a bank BNK, a first electrode EL1, a second electrode EL2, a first contact electrode CNE1, a second contact electrode CNE2, a light emitting element LD, and an insulating layer INS.

The bank BNK may be provided or disposed on the substrate SUB. In detail, the bank BNK may be provided or disposed on the buffer layer BFL provided or disposed on a surface of the substrate SUB and define an emission area in the unit emission area. In this embodiment, two adjacent banks BNK may be disposed on the substrate SUB at positions spaced apart from each other by a predetermined distance. For example, the adjacent banks BNK may be disposed over the substrate SUB at positions spaced apart from each other by a distance greater than the length of the light emitting element LD. Each bank BNK may be made of an insulating material including an inorganic material or an organic material, but it is not limited thereto.

The first electrode EL1 and the second electrode EL2 may be provided or disposed on the bank BNK. The first electrode EL1 and the second electrode EL2 each may have a shape substantially corresponding to the shape of the bank BNK. In other words, the first electrode EL1 and the second electrode EL2 each may have a shape substantially corresponding to an inclination of the bank BNK.

The first and second electrodes EL1 and EL2 may be alignment electrodes that may align the light emitting elements LD.

The first electrode EL1 and the second electrode EL2 may be disposed on the substrate SUB and spaced apart from each other with the light emitting element LD provided or disposed therebetween. One end of the first electrode EL1 and one end of the second electrode EL2 may overlap portions of the light emitting element LD.

The display element layer DPL may include a bank pattern (not illustrated) provided or disposed on the substrate SUB. The bank pattern may have a substantially trapezoidal cross-section which may be reduced in width from the bottom to the top, but it is not limited thereto. Alternatively, the bank pattern and the bank BNK each may have a substantially curved surface having a substantially semi-circular or a substantially semi-elliptical cross-section which may be reduced in width from the bottom to the top. In the disclosure, the shape and/or the inclination of the bank pattern and the bank BNK is not particularly limited, and it may be changed in various ways within the spirit and the scope of the disclosure.

The first insulating layer INS1 may be provided or disposed on the first and second electrodes EL1 and EL2 and the buffer layer BFL. The light emitting element LD may be provided or disposed on the first insulating layer INS1. The first contact electrode CNE1 may be provided or disposed on the first end EP1 of the light emitting element LD. The second contact electrode CNE2 may be provided or disposed on the second end EP2 of the light emitting element LD. The first contact electrode CNE1 may be electrically connected to or electrically coupled to the first electrode EL1 through a contact hole passing through the first insulating layer INS1. The second contact electrode CNE2 may be electrically connected to or electrically coupled to the second electrode EL1 through a contact hole passing through the first insulating layer INS1.

A second insulating layer INS2 may be provided or disposed on the light emitting element LD and the first and second contact electrodes CNE1 and CNE2. An overcoat layer may be provided or disposed over the second insulating layer INS2. The second insulating layer INS2 may be formed as the overcoat layer.

The pixel circuit layer PCL may include a reflective layer REL, a first transistor Ts, a second transistor Td, a driving voltage line DVL, and a bridge pattern BRP.

The reflective layer REL may be provided or disposed on the second insulating layer INS2 of the display element layer DPL. As described above, light emitted from the light emitting element LD may be emitted toward the bottom surface of the substrate SUB by the reflective layer REL.

An interlayer insulating layer ILD may be provided or disposed on the reflective layer REL and the second insulating layer INS2. The semiconductor layer SCL of the first transistor Ts and the semiconductor layer SCL of the second transistor Td may be provided or disposed on the interlayer insulating layer ILD. A gate electrode GE of each of the first and second transistors Ts and Td may be provided or disposed on the corresponding semiconductor layer SCL with a first gate insulating layer GI1 interposed therebetween.

The source electrode SE and the drain electrode DE that may be included in the first transistor Ts may be respectively electrically connected to or electrically coupled to the source area and the drain area of the corresponding semiconductor layer SCL through contact holes passing through the second gate insulating layer GI2 and the first gate insulating layer GI1.

The source electrode SE of the second transistor Td may be electrically connected to or electrically coupled to the source area of the corresponding semiconductor layer SCL through a contact hole passing through the second gate insulating layer GI2 and the first gate insulating layer GI1.

The drain electrode DE of the second transistor Td may be electrically connected to or electrically coupled to the drain area of the corresponding semiconductor layer SCL through a contact hole passing through the second gate insulating layer GI2 and the first gate insulating layer GI1. The drain electrode DE of the second transistor Td may be electrically connected to or electrically coupled to the second contact electrode CNE2, through a first opening OPN1 that may sequentially pass through the second gate insulating layer GI2, the first gate insulating layer GI1, the interlayer insulating layer ILD, and the second insulating layer INS2.

The driving voltage line DVL may be provided or disposed on the first gate insulating layer GI1. The bridge pattern BRP may be electrically connected to or electrically coupled to the driving voltage line DVL through a contact hole that passes through the second gate insulating layer GI2. The bridge pattern BRP may be electrically connected to or electrically coupled to the first contact electrode CNE1 through a second opening OPN2 that may sequentially pass through the second gate insulating layer GI2, the first gate insulating layer GI1, the interlayer insulating layer ILD, and the second insulating layer INS2.

The pixel circuit layer PCL may include a passivation layer PSV that may cover or overlap the first transistor Ts and the second transistor Td. A driving pad (not illustrated) electrically connected to or electrically coupled to the driver that may drive the pixels PXL may be provided or disposed on the passivation layer PSV. The driving pad may be electrically connected to or electrically coupled to the drain electrode DE of the second transistor Td through a contact hole passing through the passivation layer PSV. An encapsulation layer (not illustrated) may be provided or disposed on the passivation layer PSV on which the driving pad may be provided or disposed.

Figure 9:
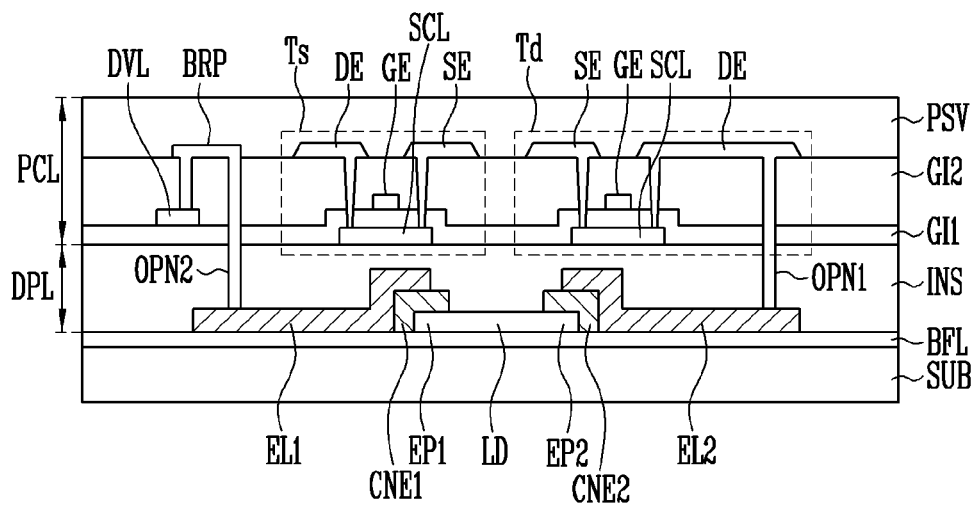
FIG. 9 is a schematic cross-sectional view illustrating a display device in accordance with an embodiment.

FIG. 9 is a schematic cross-sectional view illustrating a display device in accordance with an embodiment. In an embodiment, the following description will be mainly focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

The display device may include a substrate SUB, a display element layer DPL, and a pixel circuit layer PCL. The display element layer DPL may include a first electrode EL1, a second electrode EL2, a first contact electrode CNE1, a second contact electrode CNE2, a light emitting element LD, and an insulating layer INS.

The light emitting element LD may be provided or disposed on the substrate SUB. In detail, the light emitting element LD may be provided or disposed on a buffer layer BFL provided or disposed on a surface of the substrate SUB. The first contact electrode CNE1 may be provided or disposed on a first end EP1 of the light emitting element LD and the substrate SUB. The second contact electrode CNE2 may be provided or disposed on a second end EP2 of the light emitting element LD and the substrate SUB.

The first contact electrode CNE1 and the second contact electrode CNE2 may be provided or disposed on light emitting elements LD after the light emitting elements LD have been aligned.

For example, methods of aligning the light emitting elements LD on the substrate SUB may include: a method of diffusing the light emitting elements LD on the surface of a solvent contained in a container, aligning the light emitting elements LD to an imprinting head by disposing an imprinting head on the surface of the solvent and applying a voltage to the imprinting head, and then imprinting, on the substrate SUB, the light emitting elements LD aligned to the imprinting head; and a method of providing the light emitting elements LD on the substrate using a dip-pen. The methods of aligning the light emitting elements LD on the substrate SUB are not limited to the foregoing examples.

The first electrode EL1 may be provided or disposed on the first contact electrode CNE1 and the substrate SUB. The second electrode EL2 may be provided or disposed on the second contact electrode CNE2 and the substrate SUB. The first electrode EL1 and the second electrode EL2 may be provided or disposed on the substrate SUB and may be spaced apart from each other with the light emitting element LD disposed therebetween.

The first electrode EL1 and the second electrode EL2 may be reflective electrodes that may reflect, toward the second surface of the substrate SUB, light emitted from the light emitting element LD. Referring to FIG. 9, light emitted from the light emitting element LD may be reflected by the first and second electrodes EL1 and EL2 and emitted toward the second surface (for example, the bottom surface) of the substrate SUB.

In an embodiment, light emitted from the light emitting element LD may be reflected by the first and second electrodes EL1 and EL2, or only the first and second electrodes EL1 and EL2, and emitted toward the bottom surface of the substrate SUB. The surface area with which light emitted from the light emitting element LD may be emitted toward the bottom surface of the substrate SUB may be increased, so that collectively the bottom emission of the display device may be enhanced.

Different from the above-mentioned embodiments, the display device in accordance with an embodiment may not include a reflective layer REL that overlaps the light emitting element LD, so that light emitted from the light emitting element LD may be reflected by only the first and second electrodes EL1 and EL2 and emitted toward the bottom surface of the substrate SUB.

An insulating layer INS may be provided or disposed on the light emitting element LD, the first and second contact electrodes CNE1 and CNE2, the first and second electrodes EL1 and EL2, and the buffer layer BFL. The insulating layer INS may be a single-layer structure or a multi-layer structure including two or more layers. The insulating layer INS may include an opening through which a portion of one of the first and second electrodes EL1 and EL2 may be exposed. For example, the insulating layer INS may include an opening OPN2 through which a portion of the first electrode EL1 may be exposed, and an opening OPN1 through which a portion of the second electrode EL2 may be exposed. One of the first and second electrodes EL1 and EL2 may be electrically connected to or electrically coupled with a transistor of the pixel circuit layer PCL through the openings OPN1 and OPN2 formed or disposed in the insulating layer INS.

The pixel circuit layer PCL may include a first transistor Ts, a second transistor Td, a driving voltage line DVL, and a bridge pattern BRP.

The semiconductor layer SCL of the first transistor Ts and the semiconductor layer SCL of the second transistor Td may be provided or disposed on the insulating layer INS. A gate electrode GE of each of the first and second transistors Ts and Td may be provided or disposed on the corresponding semiconductor layer SCL with a first gate insulating layer GI1 interposed therebetween.

The source electrode SE and the drain electrode DE that may be included in the first transistor Ts may be respectively electrically connected to or electrically coupled to the source area and the drain area of the corresponding semiconductor layer SCL through contact holes passing through the second gate insulating layer GI2 and the first gate insulating layer GI1.

The source electrode SE of the second transistor Td may be electrically connected to or electrically coupled to the source area of the corresponding semiconductor layer SCL through a contact hole passing through the second gate insulating layer GI2 and the first gate insulating layer GI1.

The drain electrode DE of the second transistor Td may be electrically connected to or electrically coupled to the drain area of the corresponding semiconductor layer SCL through a contact hole passing through the second gate insulating layer GI2 and the first gate insulating layer GI1. The drain electrode DE of the second transistor Td may be electrically connected to or electrically coupled to the second contact electrode CNE2 through a first opening OPN1 that may sequentially pass through the second gate insulating layer GI2, the first gate insulating layer GI1, the insulating layer INS.

The driving voltage line DVL may be provided or disposed on the first gate insulating layer GI1. The bridge pattern BRP may be electrically connected to or electrically coupled to the driving voltage line DVL through a contact hole that passes through the second gate insulating layer GI2. The bridge pattern BRP may be electrically connected to or electrically coupled to the first contact electrode CNE1 through a second opening OPN2 that may sequentially pass through the second gate insulating layer GI2, the first gate insulating layer GI1, and the insulating layer INS.

The pixel circuit layer PCL may include a passivation layer PSV that may cover or overlap the first transistor Ts and the second transistor Td. A driving pad (not illustrated) electrically connected to or electrically coupled to the driver that may drive the pixels PXL may be provided or disposed on the passivation layer PSV. The driving pad may be electrically connected to or electrically coupled to the drain electrode DE of the second transistor Td through a contact hole passing through the passivation layer PSV. An encapsulation layer (not illustrated) may be provided or disposed on the passivation layer PSV on which the driving pad may be provided or disposed.

In an embodiment, the number of masks required for a process of manufacturing the display device may be reduced. Different from the process of manufacturing the display device of a pixel circuit layer provided or disposed on a surface of the substrate and a display element layer provided or disposed on the pixel circuit layer, a process of forming alignment lines that may align light emitting element LD on the substrate SUB and removing the alignment lines after the alignment has been performed, a process of forming the bank BNK, a process of forming the reflective layer REL, and so forth may be omitted. Therefore, the number of masks required for the process of manufacturing the display device may be effectively reduced.

The display element layer DPL may be formed or disposed on the substrate SUB, and the pixel circuit layer PCL may be formed or disposed after a test for the display element layer DPL has been performed. Therefore, a product loss rate during the manufacturing process may be reduced.

Various embodiments may provide a display device which has a structure capable of inducing effective light emission and the manufacturing thereof.

Embodiments have been disclosed herein, and although specific terms may be employed, they are used and are to be interpreted in a generic and descriptive sense only and not for purpose of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A display device comprising:
    a substrate;
    a display element layer disposed on a first surface of the substrate and including a light emitting element that emits light, the display element layer including:
        a first contact electrode electrically connected to a first end of the light emitting element; and
        a second contact electrode electrically connected to a second end of the light emitting element; and
    a pixel circuit layer disposed on the display element layer and including a transistor electrically connected to the light emitting element, the pixel circuit layer including:
        a reflective layer disposed on the display element layer and overlapping the light emitting element, wherein one of the first contact electrode and the second contact electrode is electrically connected to the transistor, and
    the reflective layer reflects the light emitted from the light emitting element toward a second surface of the substrate, wherein
    the display element layer comprises a first electrode disposed between the first contact electrode and the substrate, and a second electrode disposed between the second contact electrode and the substrate, and
    the first electrode and the second electrode are spaced apart from each other with the light emitting element disposed between the first electrode and the second electrode in a plan view, such that the first electrode and the second electrode reflect a reflected light provided from the reflective layer toward the second surface of the substrate.

2. The display device according to claim 1, wherein
    the display element layer includes an insulating layer disposed on the substrate and including an opening through which a portion of one of the first contact electrode and the second contact electrode is exposed, and
    the one of the first contact electrode and the second contact electrode is electrically connected to the transistor through the opening.

3. The display device according to claim 1, wherein
    the first electrode is electrically insulated from the first contact electrode,
    the second electrode is electrically insulated from the second contact electrode, and
    the first electrode and the second electrode are not overlapped with the light emitting element in a plan view.

4. The display device according to claim 3, wherein the display element layer comprises:
    a first transparent electrode disposed between the first electrode and the substrate, and electrically connected to the first electrode; and
    a second transparent electrode disposed between the second electrode and the substrate, and electrically connected to the second electrode, and
    wherein the first transparent electrode and the second transparent electrode are spaced apart from each other with the light emitting element disposed between the first transparent electrode and the second transparent electrode.

5. The display device according to claim 4, wherein a light transmittance of each of the first transparent electrode and the second transparent electrode is greater than a light transmittance of each of the first electrode and the second electrode.

6. The display device according to claim 4, wherein a resistance value of each of the first electrode and the second electrode is less than a resistance value of each of the first transparent electrode and the second transparent electrode.

7. The display device according to claim 1, wherein the display element layer comprises:
    banks disposed on the substrate and spaced apart from each other with the light emitting element disposed between the banks; and
    a first electrode and a second electrode disposed on the banks and spaced apart from each other with the light emitting element disposed between the first electrode and the second electrode.

8. The display device according to claim 7, wherein the first contact electrode is disposed on the first electrode and electrically connected to the first electrode, and the second contact electrode is disposed on the second electrode and electrically connected to the second electrode.

9. The display device according to claim 4, wherein at least one of one end of the first transparent electrode and one end of the second transparent electrode overlaps a portion of the light emitting element.

10. The display device according to claim 4, wherein a first width of each of the first transparent electrode and the second transparent electrode is different from a second width of each of the first electrode and the second electrode.

11. The display device according to claim 10, wherein the second width is less than the first width.

\* \* \* \* \*